United States Patent
Mathuni et al.

(10) Patent No.: US 6,569,772 B2
(45) Date of Patent: May 27, 2003

(54) METHOD FOR PRODUCING AN ALTERNATING PHASE MASK

(75) Inventors: Josef Mathuni, München (DE); Jürgen Knobloch, München (DE); Christoph Nölscher, Nürnberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/075,540

(22) Filed: Feb. 14, 2002

(65) Prior Publication Data

US 2002/0127480 A1 Sep. 12, 2002

(30) Foreign Application Priority Data

Feb. 14, 2001 (DE) .......................... 101 06 819

(51) Int. Cl.[7] ............................. H01L 21/311
(52) U.S. Cl. ...................................... 438/701
(58) Field of Search .................. 438/701, 713, 438/714, 717, 718

(56) References Cited

U.S. PATENT DOCUMENTS 5,759,724 A * 6/1998 Rolson .......................... 430/5
6,180,290 B1 * 1/2001 Hsu et al. ...................... 430/5
6,200,711 B1 * 3/2001 Kurihara et al. ............... 430/5

FOREIGN PATENT DOCUMENTS

| DE | 42 29 157 C2 | 3/1993 |
| DE | 197 56 518 A1 | 1/1999 |
| EP | 0 451 307 B1 | 10/1991 |

OTHER PUBLICATIONS

Hisashi Watanabe et al.: "Transparent phase shifting mask with multistage phase shifter and comb-shaped shifter", SPIE, vol. 1463, Optical/Laser Microlithography IV, 1991, pp. 101–110.

Christoph Nölscher: "Phasenmaskenkonzepte und—technologien" [phase mask concepts and technologies], VDI–Berichte No. 935, 1991, pp. 61–80; Junji Miyazaki et al.: A New phase–shifting Mask Structure for Positive Resist Process, SPIE, vol. 1464, Integrated Circuit Metrology, Inspection, and Process Control V, 1991, pp. 327–335.

Uwe A. Griesinger et al.: Transmission & Phase Balancing of alternating Phase Shifting Masks (5X)—Theoretical & Experimental Results, SPIE, vol. 3873, 1999, pp. 359–369.

S. Kobayashi et al.: "Development of simplified process for KrF excimer half–tone mask with chrome–shielding method", SPIE, vol. 3873, 1999, pp. 288–296.

Junji Miyazaki et al.: A New phase–shifting Mask Structure for Positive Resist Process, SPIE, vol. 1464, Integrated Circuit Metrology, Inspection, and Process Control V, 1991, pp. 327–335.

* cited by examiner

Primary Examiner—David Nelms
Assistant Examiner—Quoc Hoang
(74) Attorney, Agent, or Firm—Laurence A. Greenberg; Werner H. Stemer; Ralph E. Locher

(57) ABSTRACT

A carrier has a surface with a mask layer thereon. An irradiation-sensitive layer on the mask layer is exposed and developed to form a first exposure structure. The first exposure structure is used as an etching mask while the mask layer is etched. The first exposure structure is subsequently removed. A second irradiation-sensitive layer is applied to the mask layer and the carrier. The second irradiation-sensitive layer is exposed with a first exposure dose and a second exposure dose. The second irradiation-sensitive layer is subsequently developed to form a second exposure structure with a first and second exposure structure thickness. The carrier is etched down to a first etching depth in the region of the first exposure structure thickness and down to a second etching depth in the region of the second exposure structure thickness. The first etching depth is larger than the second etching depth.

8 Claims, 3 Drawing Sheets

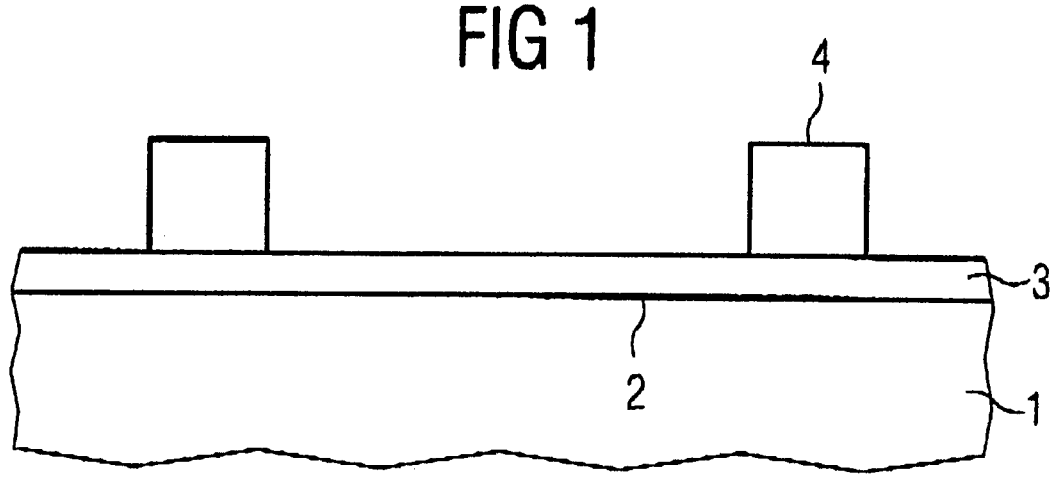
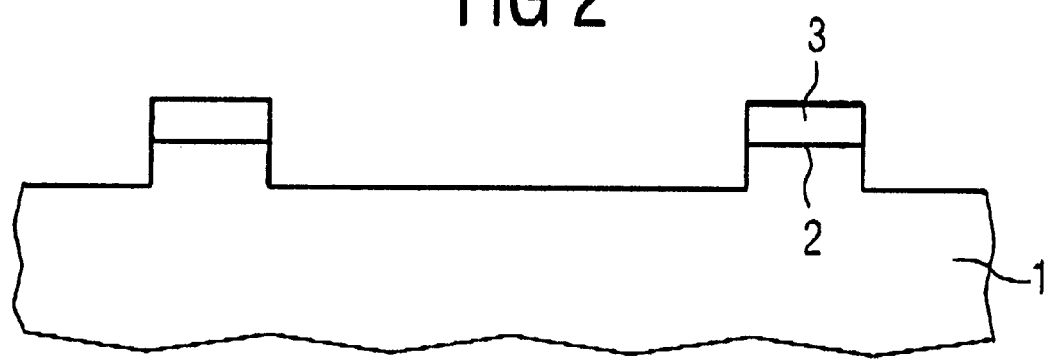

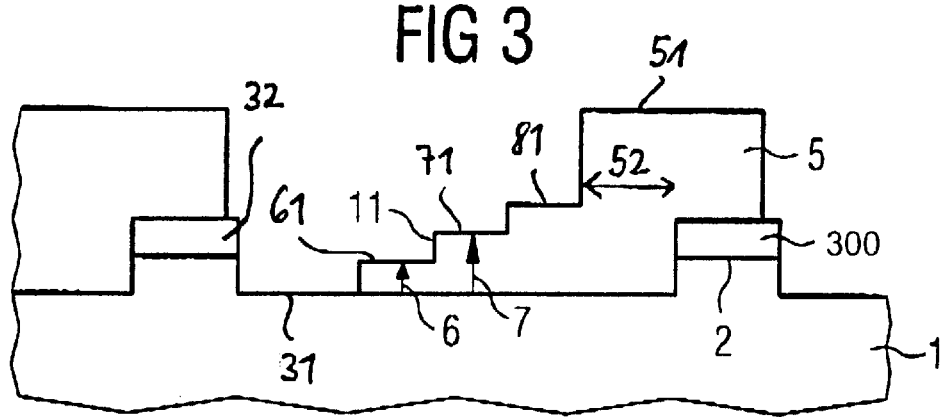
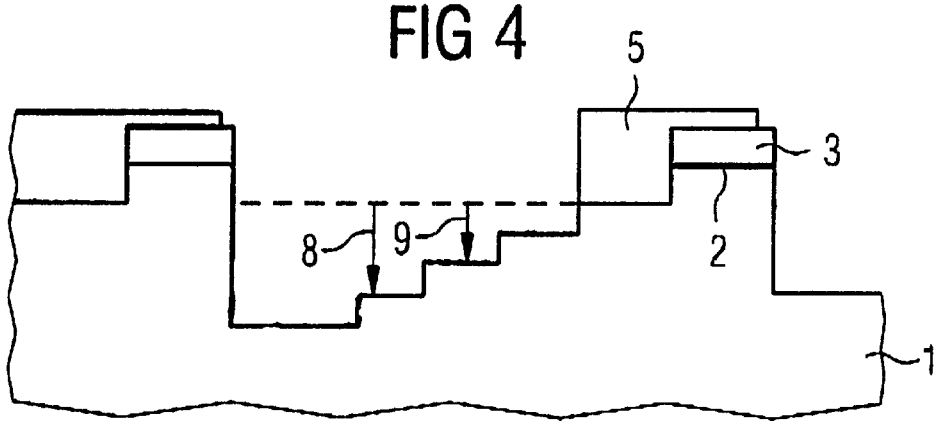
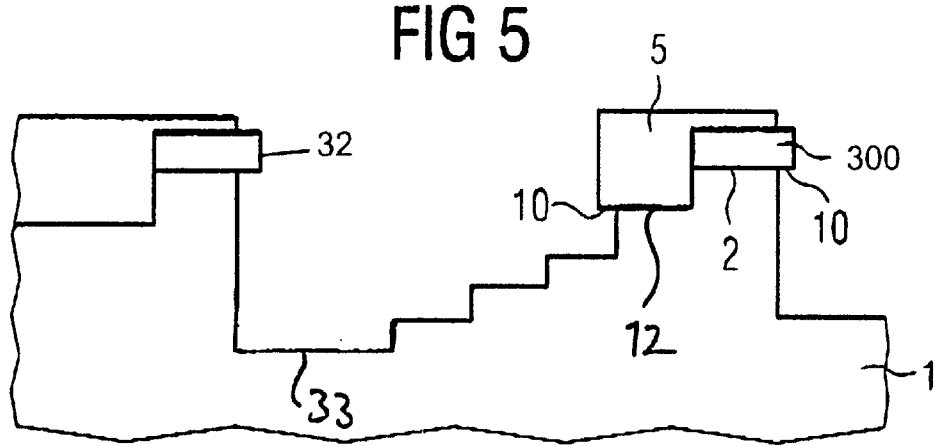

METHOD FOR PRODUCING AN ALTERNATING PHASE MASK

BACKGROUND OF THE INVENTION

Field of the Invention

The present invention relates to a method for producing an alternating phase mask which is suitable for patterning semiconductor components.

Phase masks can be used to influence the phase relationships, in a targeted manner, of the light used for exposing photosensitive layers on semiconductor components. By using such a phase mask, the image contrast and the depth of focus are improved in the case of an optical projection exposure. By way of example, it is known from Nölscher, VDI Reports 935 (1991), pages 61–80 that multistep phase masks can be used as a transition between two regions with a different phase shift in order to avoid an expensive double exposure (trim exposure) of a semiconductor substrate.

Furthermore, it is known from the prior art that e.g. photoresist can be used as a phase shifter. This is described, for example, in Watanabe et al., SPIE 1463 (1991), page 110 et seq., and Miyazaki et al., SPIE 1464 (1991), page 327 et. seq. However, these methods are unsuitable for practical use with an exposure wavelength in the deep UV (Ultraviolet) range.

A single-step resist thickness modulation is used by Kobayashi et al., SPIE 3873 (1999), pages 288–296. The different resist thickness is utilized during dry etching in order to pattern half-tone phase masks with a chromium mask layer. In contrast thereto, in the present application, a half-tone phase mask is not produced, but rather an alternating phase mask is produced and the carrier material is etched.

Patterning a multistep transition between regions of different phases is described in Issued European Patent EP 0 451 307 B1, for example. What is disadvantageous in this case, however, is that a complete process sequence comprising resist coating, exposure, development, and etching of the quartz carrier has to be carried out for each region of the phase mask that is produced for a defined phase shift. Consequently, using multistep phase masks is expensive and impracticable for defect-free masks.

German Patent Application DE 197 56 518 A1 and Issued German Patent DE 42 29 157 C2 show phase masks with a stepped transition between the phase shifter and the substrate. Etching masks that are progressively recessed are used to produce the stepped transition.

SUMMARY OF THE INVENTION

It is accordingly an object of the invention to provide a method for producing an alternating phase mask which overcomes the above-mentioned disadvantages of the prior art methods of this general type.

In particular, it is an object of the invention to provide a method which enables a phase mask to be produced cost-effectively and in a manner that saves time.

With the foregoing and other objects in view there is provided, in accordance with the invention, a method for producing an alternating phase mask that includes steps of: providing a carrier having a surface with a mask layer configured thereon; applying a first irradiation-sensitive layer on the mask layer; irradiating the first irradiation-sensitive layer; developing the first irradiation-sensitive layer and partly removing the first irradiation-sensitive layer to form a first exposure structure; using the first exposure structure as an etching mask while etching the mask layer to remove the mask layer at locations where the first irradiation-sensitive layer was removed; after etching the mask layer, removing the first exposure structure; applying a second irradiation-sensitive layer to the mask layer and the carrier; determining a first exposure dose and a second exposure dose; at locations at which the first mask layer has been removed, irradiating the second irradiation-sensitive layer with the first exposure dose and elsewhere with the second exposure dose; developing the second irradiation-sensitive layer to form a second exposure structure that has a first exposure structure thickness at locations that were exposed with the first exposure dose and that has a second exposure structure thickness, different from the first exposure structure thickness, at locations that were exposed with the second exposure dose; and etching the carrier at locations that are not covered by the second exposure structure and etching the second exposure structure with essentially the same etching selectivity such that the carrier is etched down to a first etching depth in the region of the first exposure structure thickness and down to a second, smaller etching depth in the region of the second exposure structure thickness.

The second exposure structure is exposed by multiple irradiations with different doses. This can be performed for example, using light, electrons or ions. After conventionally developing the second irradiation-sensitive layer, a second exposure structure having a first thickness and a second thickness is formed in the second irradiation-sensitive layer. An etching step, which can be performed, for example, as an isotropic or as an anisotropic etching step, transfers the exposure structure to the carrier. By way of example, if the second exposure structure and the carrier have a similar etching selectivity and if an anisotropic etching is performed, then the step structure of the second irradiation-sensitive layer with the different exposure structure thicknesses is transferred to the carrier. Afterwards, the second exposure structure can be removed from the carrier. The phase mask produced is advantageously robust with respect to cleaning steps. Furthermore it can be produced with significantly fewer process steps than is known from the prior art. The second exposure structure is exposed by irradiation with short-wave light, electrons or ions, in particular by a laser beam or an electron beam. The laser or electron beam is guided over the area to be exposed using a corresponding control. In this case, according to the invention, the exposure dose is modulated. Irrespective of whether laser beams or electron beams are used, the term exposure is used in both cases.

In accordance with an added feature of the invention, the carrier is etched isotropically while undercutting the mask layer or the second exposure structure parallel to the surface. So-called intensity balancing is advantageously made possible by the undercut. This is known for example from the publication Griessinger et al., SPIE 3873 (1999), pages 359–369. The intensity balancing performed has the advantage that the imaged intensity becomes independent of the etching depth. The intensity difference in the image of adjacent mask openings becomes largely independent of the etching depth of the openings.

In accordance with an additional feature of the invention, before etching the carrier, the second exposure structure is heated to a temperature of between 120° C. and 190° C. such that a step—arranged between the first exposure structure thickness and the second exposure structure thickness—in the second exposure structure becomes rounded.

The rounding or flowing of the second exposure structure has the advantage that a continuous and smooth transition, similar to a ramp, is produced in the second exposure structure. During the subsequent etching of the carrier, the continuous ramp is transferred to the carrier, thereby producing a continuous transition in the phase mask between a first region with a first phase shift and a second region with a second phase shift.

In accordance with a further feature of the invention, the carrier is formed from quartz and/or the mask layer is formed from chromium.

In accordance with a concomitant feature of the invention, the etching of the carrier is performed using an etching gas that contains $CHF_3$ and oxygen. A mixture of $CHF_3$ and oxygen makes it possible, for example, to set an etching selectivity with which the second exposure structure is etched at a similar etching rate to the carrier.

Other features which are considered as characteristic for the invention are set forth in the appended claims.

Although the invention is illustrated and described herein as embodied in a method for producing an alternating phase mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a carrier with a mask layer and an exposure structure;

FIG. 2 shows the carrier from FIG. 1 after a patterning step has been performed;

FIG. 3 shows the carrier from FIG. 2 with a second exposure structure;

FIG. 4 shows the carrier from FIG. 3 after an etching step;

FIG. 5 shows the carrier from FIG. 4 after a further etching step;

DESCRIPTION OF THE PREFERRED EMBODIMENTS

Figure 6:
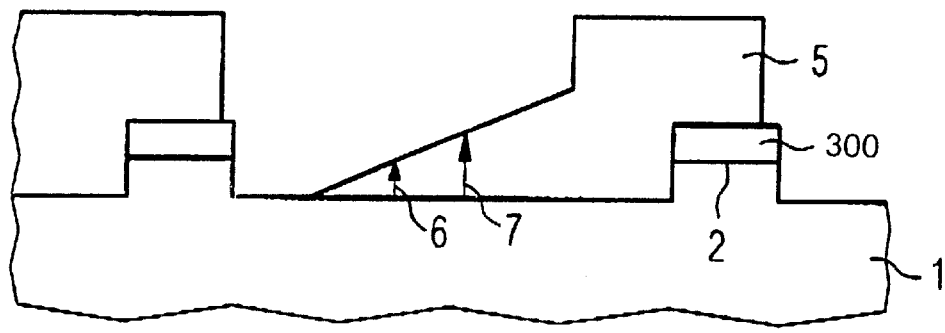
FIG. 6 shows the carrier from FIG. 3 after a temperature step.

Referring now to the figures of the drawing in detail and first, particularly, to FIG. 1 thereof, there is shown a carrier 1 having a surface 2. A mask layer 3 is arranged on the surface 2. The carrier 1 contains quartz, for example, and the mask layer 3 contains chromium, for example. An exposure structure 4 is arranged on the mask layer 3.

A method for producing the arrangement illustrated in FIG. 1 first provides the carrier 1 with the surface 2 and the mask layer 3. A first irradiation-sensitive layer is applied on the mask layer 3. The first irradiation-sensitive layer is first exposed and is then developed to form the first exposure structure 4. The exposure is effected using a laser or an electron beam. In the automatic exposure machine, a deflection control mechanism is used to guide the laser beam or the electron beam over the area being exposed. The irradiation-sensitive layer, e.g. a photoresist, is developed depending on the exposure. The photoresist is developed depending on the exposure. The exposed part of the photoresist is removed in order to form the first exposure structure 4.

With reference to FIG. 2, the first mask layer 3 is etched using the first exposure structure 4 as an etching mask. The first exposure structure 4 is subsequently removed. The etching of the first mask layer 3, as illustrated in FIG. 2, may selectively stop on the carrier 1, for example. Equally, it is possible to perform an overetch, so that the carrier 1 is likewise sunk slightly. Furthermore, it is possible for the carrier 1 to be sunk to a predetermined depth with the same mask in a subsequent etching step. The sinking into the carrier 1 in this case is optional. The opaque mask layer 3, formed from chromium, for example, is removed at the areas not covered by the first exposure structure 4, thereby producing the result shown in FIG. 2.

With reference to FIG. 3, a second irradiation-sensitive layer is subsequently applied to the mask layer 3 and to the carrier 1. Afterward, a first exposure dose and a second exposure dose are determined, and a first location of the second irradiation-sensitive layer is exposed with the first exposure dose and a second exposure location of the second irradiation-sensitive layer is exposed with the second exposure dose. As a result of this, the second irradiation-sensitive layer is exposed to different extents, so that, during the subsequent development of the second irradiation-sensitive layer, a second exposure structure 5 made of residual material of the second irradiation-sensitive layer is formed. The second exposure structure 5 has a first exposure structure thickness 6 and a second exposure structure thickness 7. A step 11 is formed in the second exposure structure 5, between the first exposure structure thickness 6 and the second exposure structure thickness 7. Exposure is effected to a greater extent in section 61 of the second irradiation-sensitive layer than in section 71 of the second irradiation-sensitive layer. After development of the photoresist, the photoresist is removed more deeply in section 61 than in section 71. The photoresist is removed completely in the section 31. As a result, the thickness 6 of the residual photoresist in section 61 is formed such that it is smaller than the thickness 7 in section 71. In section 31, the surface of the carrier 1 composed of quartz reaches the surface. The regions in which the mask is subsequently etched lie between the residual sections 300, 32 of the first mask layer 3. The regions to be etched run transversely with respect to the residual sections 300, 32 of the imaging mask (first mask layer) 3 that is formed by the chromium layer. A region 51 of the second irradiation-sensitive layer is not exposed. This region 51 covers the residual section 300—illustrated on the right—of the imaging mask 3 and this region 51 directly adjoins the residual section 300 of the imaging mask 3. A section 81 adjoins the left side of the region 51. Section 81 is spaced apart toward the left by a distance 52 from the residual section 300 that is made of chromium. Section 81 is exposed with a low irradiation dose. Section 71, which is immediately to the left of section 81, is exposed to an extent that is greater than the dose used to expose section 81. Section 61, which is immediately to the left of section 71 is exposed to an extent that is greater than the dose used to expose section 71. Finally, section 31, which is immediately to the left of section 61 is exposed to an extent that is greater than the dose used to expose section 61. Section 31 is adjoined by another residual section 32 of the imaging mask 3 made of chromium.

With reference to FIG. 4, the carrier 1 and the second exposure structure 5 are subsequently etched. If the etching removal rate of the carrier 1 is identical to the etching removal rate of the second exposure structure 5, then the vertical profile of the second exposure structure 5 can be transferred to the carrier 1 by performing anisotropic etching. In this case, by way of example, the carrier 1 is etched down to an etching depth 8 in the region of the first exposure structure thickness 6 and down to an etching depth 9 in the region of the second exposure structure thickness 7. If the first exposure structure thickness 6 is formed such that it is smaller than the second exposure structure thickness 7, then the first etching depth 8 in the region of the first exposure structure thickness 6 is formed such that it is larger than the second etching depth 9 in the region of the second exposure structure thickness 7. By way of example, a mixture of the gases $CHF_3$ and oxygen is suitable for etching the carrier 1 and the second exposure structure 5. The etching selectivity of the etching gas is virtually identical with regard to the exposure structure 5 and with regard to the carrier 1 that is made from quartz. As a result, material is removed from the second exposure structure 5 and from the quartz carrier 1 at identical rates. The material is removed superficially, so that where the quartz carrier 1 is not covered by the second exposure structure 5, the carrier 1 is etched, otherwise the second exposure structure 5 itself is etched.

With reference to FIG. 5, an isotropic etching step is performed to etch the carrier 1. In the process, an undercut 10 is obtained that extends under the mask layer 3 or under the second exposure structure 5 and parallel to the surface 2. The undercut 10 makes it possible to perform intensity balancing. The corner rounding as a result of the isotropic etching is not illustrated for the sake of simplicity. As a result, an exposure mask for exposing semiconductor wafers, for example, is formed which has opaque chromium sections 300, 32 and which also has a first region 12 and a second region 33. For the light that is used to expose the wafer, the first region 12 and the second region 33 have phase shifts that differ by 180°. By way of example, the region 12 has a phase shift of 0° and the region 33 has a phase shift of 180°. In the intervening section between the regions 12, 33 having different phase shifts, the quartz carrier 1 has a stepped transition that is produced in the manner described above. What is produced overall, then, is an alternating phase mask with a stepped transition between regions of different phase shifts for light that is suitable for producing an optical image, for example, for exposing structures on a semiconductor wafer for producing integrated circuits.

FIG. 6 illustrates steps that would follow FIG. 3 in a production order. The second exposure structure 5 is heated to a temperature of between 120° C. and 190° C. before etching the carrier 1. The step 11 is rounded and the stepped structure of the second exposure structure 5 illustrated in FIG. 3 is converted into a ramped structure as shown in FIG. 6. The photoresist forming the second exposure structure 5 is stable up to 120° C. The photoresist flows at a higher temperature. Relatively good rounding of the photoresist can be achieved in the range between 120° C. and 190° C., in order to produce a ramped structure as shown in FIG. 6.

Figure 7:
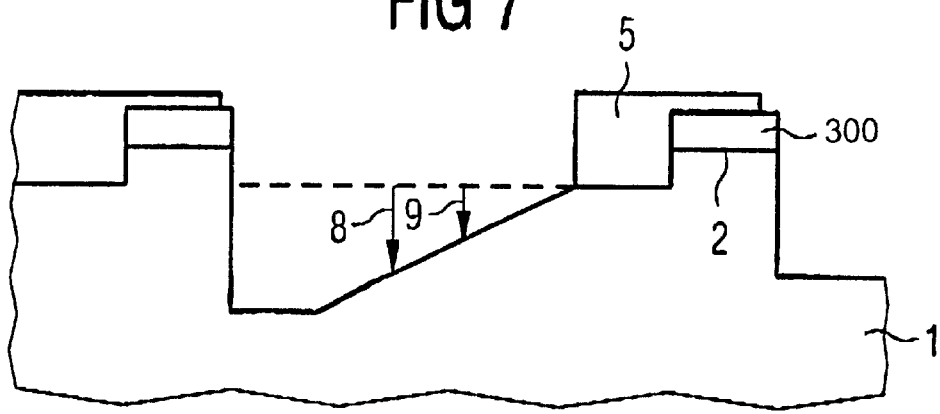
FIG. 7 shows the carrier from FIG. 6 after an etching step.

With reference to FIG. 7, an etching step is performed which transfers the vertical profile of the second exposure structure 5 to the carrier 1. This may involve, for example, isotropic or anisotropic etching. The process steps in accordance with FIG. 7 correspond to those for producing the structure illustrated in FIG. 4.

Figure 8:
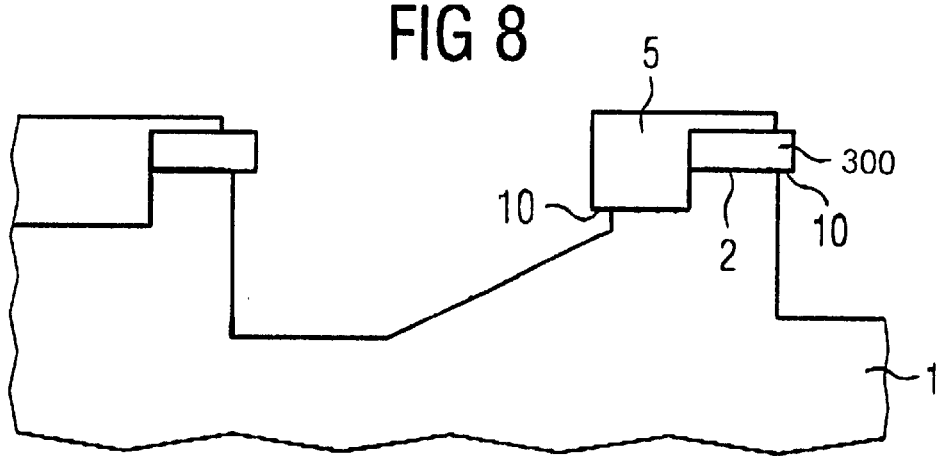
FIG. 8 shows the carrier from FIG. 7 after a further etching step.

With reference to FIG. 8, an undercut 10 is performed, which corresponds to the undercut from FIG. 5.

We claim:

1. A method for producing an alternating phase mask, which comprises:
   providing a carrier having a surface with a mask layer configured thereon;
   applying a first irradiation-sensitive layer on the mask layer;
   irradiating the first irradiation-sensitive layer;
   developing the first irradiation-sensitive layer and partly removing the first irradiation-sensitive layer to form a first exposure structure;
   using the first exposure structure as an etching mask while etching the mask layer to remove the mask layer at locations where the first irradiation-sensitive layer was removed;
   after etching the mask layer, removing the first exposure structure;
   applying a second irradiation-sensitive layer to the mask layer and the carrier;
   determining a first exposure dose and a second exposure dose;
   at locations at which the first mask layer has been removed, irradiating the second irradiation-sensitive layer with the first exposure dose and elsewhere with the second exposure dose;
   developing the second irradiation-sensitive layer to form a second exposure structure that has a first exposure structure thickness at locations that were exposed with the first exposure dose and that has a second exposure structure thickness, different from the first exposure structure thickness, at locations that were exposed with the second exposure dose; and
   etching the carrier at locations that are not covered by the second exposure structure and etching the second exposure structure with essentially an equal etching selectivity such that the carrier is etched down to a first etching depth in a region of the first exposure structure thickness and down to a second, smaller etching depth in a region of the second exposure structure thickness.

2. The method according to claim 1, which comprises, during the step of etching the carrier, undercutting an element, which is selected from the group consisting of the mask layer and the second exposure structure, parallel to the surface of the carrier.

3. The method according to claim 2, which comprises: before the step of etching the carrier, heating the second exposure structure to a temperature between 120° C. and 190° C. such that a step, which is configured in the second exposure structure between the first exposure structure thickness and the second exposure structure thickness, becomes rounded.

4. The method according to claim 1, which comprises: before the step of etching the carrier, heating the second exposure structure to a temperature between 120° C. and 190° C. such that a step, which is configured in the second exposure structure between the first exposure structure thickness and the second exposure structure thickness, becomes rounded.

5. The method according to claim 1, which comprises: forming the carrier from quartz.

6. The method according to claim 5, which comprises: forming the mask layer from chromium.

7. The method according to claim 1, which comprises: forming the mask layer from chromium.

8. The method according to claim 1, which comprises: performing the step of etching the carrier using an etching gas that contains $CHF_3$ and oxygen.

* * * * *